US009153468B2

(12) United States Patent
Emoto et al.

(10) Patent No.: US 9,153,468 B2
(45) Date of Patent: Oct. 6, 2015

(54) LOAD PORT APPARATUS

(75) Inventors: Jun Emoto, Tokyo (JP); Tadamasa Iwamoto, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 738 days.

(21) Appl. No.: 13/541,101

(22) Filed: Jul. 3, 2012

(65) Prior Publication Data

US 2013/0011223 A1    Jan. 10, 2013

(30) Foreign Application Priority Data

Jul. 8, 2011  (JP) .................................. 2011-151915

(51) Int. Cl.
*B65B 31/00* (2006.01)
*H01L 21/677* (2006.01)

(52) U.S. Cl.
CPC .............................. *H01L 21/67772* (2013.01)

(58) Field of Classification Search
CPC ................................................ H01L 21/67772
USPC ...................... 141/37, 51, 63, 98; 414/222.01
See application file for complete search history.

(56) References Cited

U.S. PATENT DOCUMENTS 7,841,371 B2    11/2010 Okabe
2002/0069933 A1*  6/2002 Otaguro .......................... 141/98
2009/0169342 A1    7/2009 Yoshimura et al.

FOREIGN PATENT DOCUMENTS

JP    WO2005/124853    12/2005
JP    2007-180517    7/2007

OTHER PUBLICATIONS

U.S. Appl. No. 13/585,357, filed Aug. 14, 2012, Emoto, et al.
U.S. Appl. No. 14/583,934, filed Dec. 29, 2014, Emoto, et al.
U.S. Appl. No. 14/259,797, filed Apr. 23, 2014, Miyajima, et al.

* cited by examiner

*Primary Examiner* — Jason K Niesz
(74) *Attorney, Agent, or Firm* — Oblon, McClelland, Maier & Neustadt, L.L.P.

(57) ABSTRACT

To prevent an inert gas from stagnating in an internal space of a mount base of a load port apparatus, the load port apparatus includes: an outside air supply device for introducing an air from an external space, in which an operator works, into the internal space of the mount base; a casing surrounding a space in which a drive mechanism for a door is arranged; and a duct through which a gas inside the internal space of the casing is dischargeable.

6 Claims, 3 Drawing Sheets

LOAD PORT APPARATUS

BACKGROUND OF THE INVENTION

1. Field of the Invention

The present invention relates to what is called a front-opening interface mechanical standard (FIMS) system, that is, a load port apparatus, which is used for transferring, from one semiconductor processing apparatus to another semiconductor processing apparatus, wafers held in a sealed-type transport container called a pod, or for transferring the wafers from the semiconductor processing apparatus to the pot, during a semiconductor manufacturing process and the like.

2. Description of the Related Art

In recent years, in a general semiconductor manufacturing process, cleanliness is managed throughout the entire process by maintaining a highly clean state in only the following three spaces: inner spaces of various processing apparatus; an inner space of a pod capable of containing wafers and transporting the wafers from one processing apparatus to another processing apparatus; and a mini-environment in which the wafers are exchanged between the pod and the respective processing apparatus. Such a pod includes a main-unit portion which houses wafers therein and which has a wafer-insertion-and-removal opening formed in one side surface, and a lid which makes the inside of the pod serve as a sealed space by closing the opening. Further, a structure that defines the mini-environment includes an opening portion capable of facing the above-mentioned opening of the pod and a second opening portion arranged on the semiconductor processing apparatus side so as to face the opening portion.

The load port apparatus includes a member as a partition wall provided with the opening portion, that is, a wall called a side base, a door for closing the opening portion, a door drive mechanism for controlling operation of the door, and a mount table on which the pod is to be mounted. The side base partitions and defines the above-mentioned mini-environment. A mount base is capable of supporting the pod in such a manner as to face the opening of the pod and the opening portion each other, and brings the lid of the pod close to or apart from the door together with the pod itself. The door is capable of holding the lid of the pod. The door drive mechanism causes the door to open and close the opening portion under a state of holding the lid, and the door is caused to retract below a space between the opening portion and the second opening portion or to enter the space. A robot is arranged in the mini-environment, and the robot is capable of entering into and retracting from the inside of the pod through the opening portion and the opening of the pod, and transfers wafers between the inside of the pod and the semiconductor processing apparatus also through the second opening portion.

In the semiconductor manufacturing process, the wafers contained in the pod may have, for example, metal wiring formed thereon. Such metal wiring has a risk that, due to surface oxidation thereof, desired characteristics cannot be obtained when a device is completed. Therefore, oxygen concentration in the pod needs to be maintained at a low level. As a technology provided to meet such a demand, Japanese Patent Application Laid-Open No. 2007-180517 discloses a configuration for maintaining the oxygen concentration in the pod at a low level by generating, when the wafers are inserted into and removed from the pod, a gas curtain from an inert gas in parallel to the opening of the pod so as to suppress entrance of an oxidizing gas of the mini-environment into the pod, and by supplying the inert gas directly into the pod. Further, Domestic Re-publication of PCT International Publication No. 2005-124853 discloses a configuration for reducing the oxygen concentration in the pod by generating a space containing an inert gas at high concentration in the periphery of the opening portion of the pod, and in this state, supplying the inert gas into the pod.

The above-mentioned inert gas to be supplied for reducing the oxygen concentration is generally discharged to a space in which the inert gas is sufficiently reduced in concentration via a so-called grating for discharging a gas, which is provided in, for example, a bottom surface of the mini-environment, and further via an inert gas discharge passage. However, the inert gas may stagnate and accumulate in, for example, a region inside the mount table, which is spaced apart from a so-called downflow generated in the mini-environment and from the curtain-like gas flow disclosed in Japanese Patent Application Laid-Open No. 2007-180517 or Domestic Re-publication of PCT International Publication No. 2005-124853. Due to the presence of such a region, an operator's working environment may be deteriorated, but as exemplified in the configurations disclosed in Japanese Patent Application Laid-Open No. 2007-180517 and Domestic Re-publication of PCT International Publication No. 2005-124853, no consideration has conventionally been given for such stagnation of the inert gas.

SUMMARY OF THE INVENTION

The present invention has been made in view of the above-mentioned circumstances, and it is therefore an object of the present invention to provide a load port apparatus, which is capable of eliminating a stagnation space of an inert gas inside the apparatus, and eliminating a risk of deterioration of an operator's working environment.

In order to solve the above-mentioned problems, according to an exemplary embodiment of the present invention, there is provided a load port apparatus including: a side base serving as part of a wall that partitions a mini-environment; a door capable of closing an opening portion provided in the side base, the door being configured to hold a lid of a sealed container for containing an object to be contained, and open and close the lid of the sealed container so that the object to be contained is insertable into and removable from the sealed container; a mount base on which the sealed container is placeable, the mount base being capable of bringing the sealed container close to and apart from the opening portion; and an outside air supply device capable of introducing, into an internal space of the mount base, a gas in an external space separated from the mini-environment by the side base.

Note that, in the above-mentioned load port apparatus, it is preferred that the outside air supply device be arranged at a position communicating to the internal space of the mount base. Further, it is more preferred that the load port apparatus include: a partition cover that houses a door drive mechanism for driving the door via a lower opening portion different from the opening portion provided in the side base, and forms a gas discharge space separated from the mini-environment by the side base; and a gas discharge duct serving as a passage through which a gas inside the gas discharge space is dischargeable. Further, in the case of the above-mentioned configuration, it is more preferred that the load port apparatus include a baffle plate arranged inside the mini-environment, for collecting a gas in front of the lower opening portion when the gas flows through the mini-environment from an upper side toward a lower side of the mini-environment. Further, it is preferred that the load port apparatus further include a casing cover that is arranged on an outer side of the partition cover, and forms an auxiliary gas discharge space surrounding the gas discharge space, and it is also preferred that a lower surface of the auxiliary gas discharge space be formed of a member including at least one of a slit, a mesh, and pores. Further, it is more preferred that at least one of the mount base, the side base, and the door be arranged so that an opening of the sealed container is inclined at a predetermined angle relative to the opening portion provided in the side base.

According to the present invention, an air is introduced into the region in which the inert gas may stagnate, and the generation of the stagnation region is suppressed. Accordingly, the concentration of the inert gas can be reduced to an appropriate level, and the inert gas can be discharged to an external space other than the working space. Thus, with the use of the load port apparatus according to the present invention, a working environment suitable for the operator can be provided.

Further features of the present invention will become apparent from the following description of exemplary embodiments (with reference to the attached drawings).

DESCRIPTION OF THE EMBODIMENTS

Figure 1:
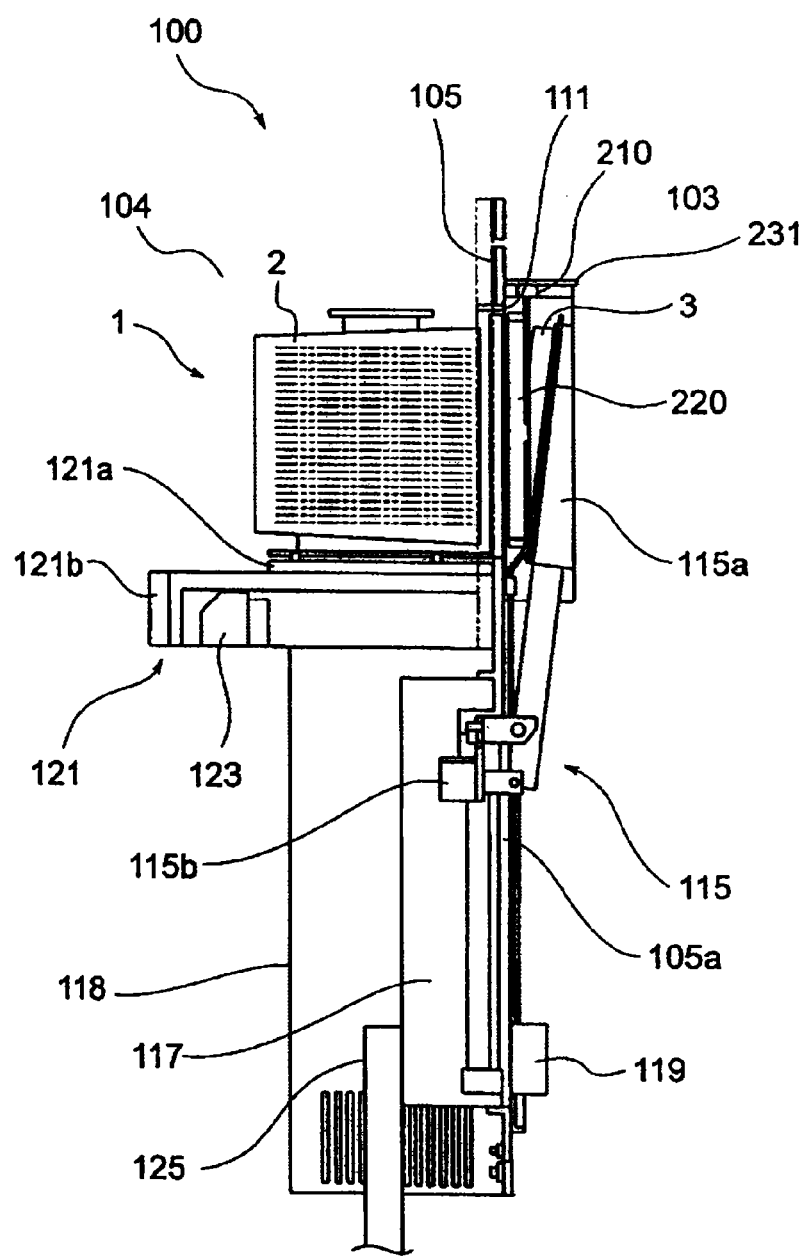
FIG. 1 is a partially sectional side view illustrating a schematic configuration of a load port apparatus according to an embodiment of the present invention under a state in which a pod is mounted on the load port apparatus.
Figure 2:
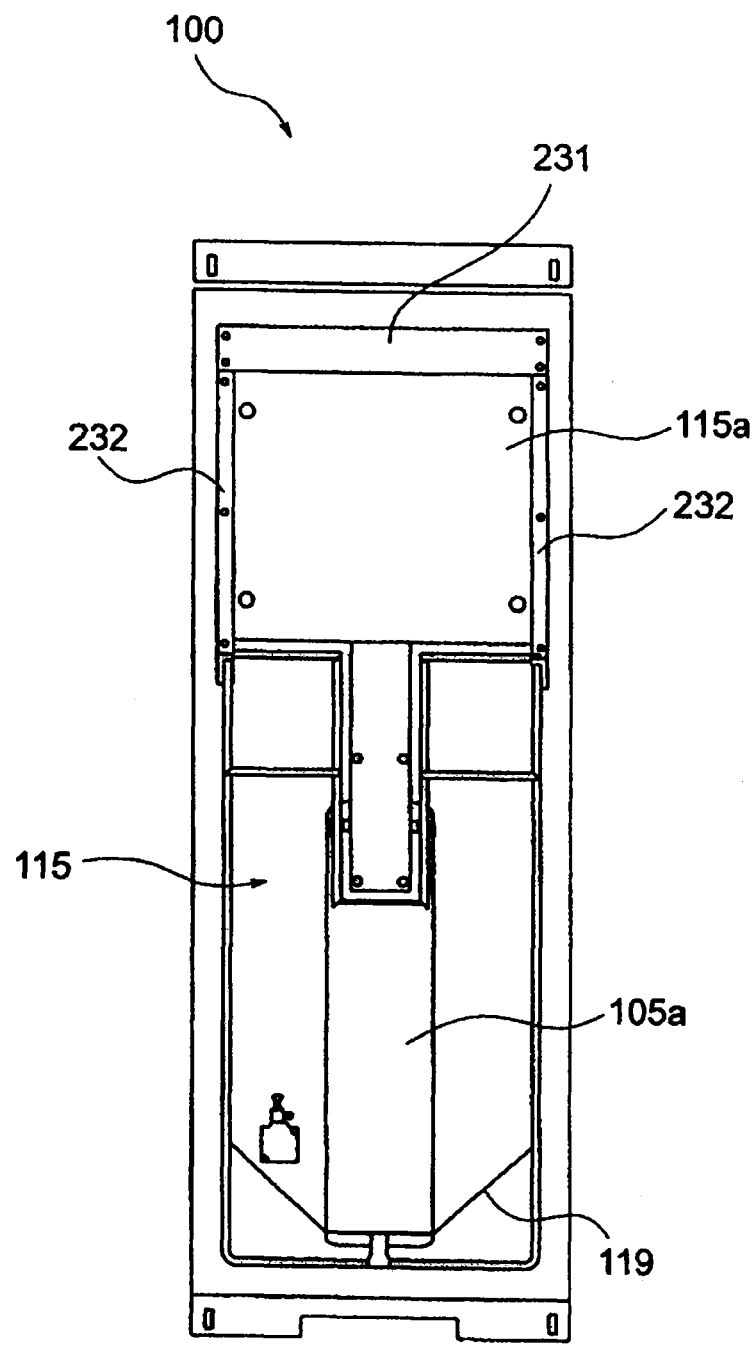
FIG. 2 is a view illustrating a schematic configuration of the load port apparatus according to the embodiment of the present invention, which is illustrated in FIG. 1, as viewed from a mini-environment side.

Exemplary embodiments of the present invention are described below with reference to the attached drawings. FIG. 1 is a side view illustrating a schematic configuration of a load port apparatus according to an embodiment of the present invention under a state in which a pod 1 is mounted on a mount table and a lid is removed from the pod 1 by a door described later. Further, FIG. 2 is a view illustrating a schematic configuration of the load port apparatus as viewed from a mini-environment side. For the description of this embodiment, the pod for containing wafers is described first. The pod 1 of FIG. 1 serving as a sealed container includes a pod main body 2 and a lid 3. The pod main body 2 is formed into a substantially cubic shape, and has a containing space therein, for containing wafers or the like as objects to be contained. Further, the pod main body 2 has an opening in one side plane of the cubic shape, and the opening communicates to the containing space. In the containing space, multiple shelves project from its side walls or the like so as to support the wafers horizontally. The shelves hold multiple wafers in the containing space horizontally at regular intervals.

A configuration of a load port apparatus 100 according to this embodiment is described below. The load port apparatus 100 includes a side base 105 that defines a mini-environment 103 separated from an external space 104, and a mount base 121 arranged adjacent to the side base 105. That is, the side base 105 serves as part of a wall that partitions the mini-environment 103 from the external space. The side base 105 includes a first opening portion 111 and a door system 115. In an upper portion of the mini-environment 103 defined by the side base 105 or the like, a fan (not shown) is arranged. The fan introduces, into the mini-environment 103, a gas which is present in the external space outside a casing of the load port apparatus 100 in a mounted state, which partitions the mini-environment 103 from the external space 104, and is set to a clean state in which dust is removed from the gas. Then, the fan generates a so-called downflow in the mini-environment 103, which is a gas flow from an upper side toward a lower side of the mini-environment 103.

Note that, the fan is additionally provided with a filter for removing contaminants, such as dust, from the gas introduced from the external space in accordance with cleanliness of the external space. In a lower portion of the mini-environment 103, a structure that enables outflow of the downflow is arranged, and dust or the like generated in the mini-environment 103 is carried by the downflow and discharged from the lower portion of the mini-environment 103 to the external space. The first opening portion 111 appears to be closed by a door 115a of the door system 115, but a clearance is formed between an outer periphery of the door 115a and an inner peripheral surface of the first opening portion 111, and hence there is herein described that the door 115a is capable of substantially closing the first opening portion 111. The door 115a is capable of holding the lid 3, and performing operations of fixing and separating the lid 3 to and from the pod main body 2.

The mount base 121 is capable of fixing the pod 1 mounted thereon, and bringing the pod 1 close to and apart from the above-mentioned first opening portion 111 (more precisely, the door 115a that closes the first opening portion 111). The mount base 121 performs an operation of advancing the pod 1 until the pod 1 becomes close to the door 115a at a predetermined interval or the pod 1 abuts against the door 115a. Under a state in which the drive of the pod 1 is stopped, the door 115a holds the lid 3. Under this state, the door 115a separates the lid 3 from the pod main body 2, and further, moves downward from the first opening portion 111 by a door drive mechanism 115b so as to cause the opening of the pod 1 to communicate to the mini-environment 103. The mount base 121 includes a mount table 121a on which the pod 1 is to be mounted actually, and a table drive unit (not shown) capable of bringing the mount table 121a close to and apart from the first opening portion 111. The table drive unit and related components thereof are covered with a table cover 121b so that dust generated in the drive mechanism does not cause deterioration of an ambient environment of the load port apparatus.

In this case, on the mini-environment 103 side of the side base 105, plates are fixed on an outer side of an upper edge and two side edges of the first opening portion 111 along the upper edge and the two side edges so that the plates are provided upright from the side base 105. A curtain nozzle 210 is fixed to a plate 231 on the upper edge side so as to form a curtain-like gas flow from an inert gas in front of the first opening portion 111. Further, purge nozzles 220 are arranged on an inner side of plates 232 on the two side edges and on an outer side of side edges of the first opening portion 111. The purge nozzles 220 are capable of supplying an inert gas into the pod main body 2 from which the lid 3 is removed. The majority of the inert gas supplied from the curtain nozzle 210 and the purge nozzles 220 is discharged from the mini-environment 103 via, for example, a grating provided at the lower portion of the mini-environment 103 and a gas discharge duct 125 coupled to a casing cover 118 described later. However, from the viewpoint of generating a pressure difference between the mini-environment 103 and an internal space of the casing cover 118 to prevent dust or the like from reaching the mini-environment, a large suction force is not easily imparted to the gas discharge duct 125 for discharging the inert gas or the like from the internal space of the casing cover 118.

Therefore, the gas is likely to stagnate in an upper portion of the casing cover 118 or an interior of the table cover 121b, which is spaced apart from the majority of the gas flow, and the concentration of the inert gas may become higher in that portion. Further, the inert gas supplied from the purge nozzles 220 may reach the interior of the table cover 121b via, for example, a clearance at a lower portion of the pod 1. In this embodiment, an outside air supply device 123 constructed of a fan or the like is arranged at a lower portion of the table cover 121b. The outside air supply device 123 is configured to supply an outside air to an internal space of the table cover 121b from the external space 104 outside the load port apparatus 100. Further, the table cover 121b has a discharge passage (not shown) for discharging an internal gas in response to the introduction of the outside air. Through the supply of a predetermined amount of the outside air to the internal space of the table cover 121b by the outside air supply device 123, the inert gas stagnating in the internal space of the table cover 121b can be discharged to the external space 104 while reducing the concentration thereof.

Note that, in this embodiment, there is described a structure in which the outside air supply device 123 is mounted directly to the table cover 121b, that is, the mount base 121. Specifically, there is described a structure in which the outside air supply device 123 is arranged at a position communicating to the interior of the mount base 121. When the outside air supply device 123 is mounted at that position, the dust or the like generated in the mount table 121a cannot reach the mini-environment 103 unless the dust or the like passes through a space surrounded by the casing cover 118. Thus, the above-mentioned structure is preferred from the viewpoint of suppressing the entrance of minute dust or the like into the mini-environment. However, the present invention is not limited to the above-mentioned arrangement. Part of the internal space which is proximate to the side base 105 is most likely to serve as a passage of the inert gas to the internal space of the table cover 121b. Thus, considering the flow of the inert gas, such arrangement of the outside air supply device 123 opposes the flow of the inert gas, which is preferred from the viewpoint of the reduction in concentration but is not preferred from the viewpoint of suppressing generation of a turbulent flow. For example, in order to cause the inert gas inside the table cover 121b to flow toward the external space 104 with relatively small turbulence generated in the flow of the inert gas, there may be employed a structure in which the outside air supply device 123 is arranged at an appropriate position of the casing cover 118.

Further, the door drive mechanism 115b supports the door 115a via a lower opening portion 105a of the side base 105. The lower opening portion 105a is an opening portion different from the above-mentioned first opening portion 111, and is arranged below the first opening portion 111. For this reason, this opening portion is referred to as "lower opening portion" in the present invention. However, the lower opening portion 105a may be arranged variously depending on the arrangement of the door drive mechanism 115b. When the gas inside the mini-environment 103 is directly sent from the lower opening portion 105a to the internal space of the casing cover 118, the inert gas may reach the internal space of the casing cover 118 without sufficient reduction in concentration. In this embodiment, the door drive mechanism 115b is covered with a partition cover 117, and further, the casing cover 118 is arranged on an outer side of the partition cover 117. Through the arrangement of the partition cover 117, an air derived from the downflow and the inert gas are first mixed with each other in an internal space of the partition cover 117, and accordingly the inert gas is reduced in concentration. In the present invention, the space defined inside the casing cover 118 by the partition cover 117 is referred to as "gas discharge space", and further, the space partitioned from the external space 104 by the casing cover 118 and arranged around the partition cover 117 is referred to as "auxiliary gas discharge space". Further, the partition cover 117 produces an effect of restricting, within the partition cover 117, influence of dust generated in the door drive mechanism 115b.

Through the addition of the partition cover 117 described above, it is possible to reduce the concentration of the inert gas inside the casing cover 118, which is contained in the gas having reached the interior of the table cover 121b via the casing cover 118. Thus, in combination with the above-mentioned outside air supply device 123, the risk of stagnation of the inert gas in the load port apparatus is greatly reduced, and safety of the external space 104 as an operator's working space can be ensured more reliably. Note that, in this embodiment, the above-mentioned gas discharge duct 125 communicates to the partition cover 117. Accordingly, the gas guided into the partition cover 117 is discharged to the external space 104 through the gas discharge duct 125, with the result that the entrance of the gas into the internal space of the casing cover 118 can be suppressed and the diffusion of the inert gas into the internal space of the casing cover 118 and further into the internal space of the table cover 121b can be prevented.

Further, a lower portion of the casing cover 118 may be closed with use of a member including a slit, a mesh, or pores so that the gas inside the casing cover 118 is discharged to the external space 104 via that member. The outside air supply device 123 adds an outside air so that the inert gas inside the table cover 121b is reduced in concentration, and further, the gas inside the mini-environment 103 is discharged through the gas discharge duct 125 communicating to the internal space of the partition cover 117 described later. Thus, in the embodiment described above, the inert gas contained in the gas inside the casing cover 118 is sufficiently reduced in concentration as compared to the conventional case, and the lower portion of the internal space of the casing cover 118 is closed with use of the member that enables the outflow of the gas, with the result that the stagnation of the inert gas in that space can be suppressed more reliably.

Note that, as described above, the gas such as the inert gas introduced into the mini-environment 103 is discharged through the gas discharge duct 125 after passing through the lower opening portion 105a on the lower side of the mini-environment 103 and through the internal space of the partition cover 117. However, in the structural aspect, the lower opening portion 105a is arranged at a center portion of the side base 105, and hence it is difficult to effectively discharge a gas which is present in the vicinity of a bottom surface of the mini-environment and at two corner portions spaced apart from the lower opening portion 105a. When the load port apparatus 100 is stopped under a state in which the gas to be discharged stagnates at the two corner portions, the inert gas which is present at the two corner portions may cause a trouble when activating the load port apparatus. In this embodiment, as a measure against such a phenomenon, a pair of opposing baffle plates 119 are arranged with an inclination relative to side edges of the lower opening portion 105a so that a distance between the baffle plates 119 are reduced toward a lower side of the lower opening portion 105a.

Through the arrangement of the baffle plates 119, the downflow, the inert gas supplied from the curtain nozzle, and the gas guided toward the lower side of the mini-environment 103 due to those gas flows are collected in front of the lower opening portion 105a as those gases approach the bottom surface of the mini-environment 103. As a result, the majority of the gas passes through the lower opening portion 105a and is guided to the internal space of the partition cover 117 so that the gas is discharged via the above-mentioned gas discharge duct 125. Note that, in this embodiment, the flat baffle plates 119 are arranged in a region that occupies approximately a lower quarter of the lower opening portion 105a. However, the arrangement of the baffle plates 119 is not limited to that in this embodiment. Alternatively, the baffle plates 119 may have such a shape that upper edges of the baffle plates 119 as viewed from the mini-environment 103 side are curved symmetrically across the lower opening portion 105a, and the baffle plates 119 may be arranged above the above-mentioned region. Further, baffle plates may additionally be arranged so as to be opposed to the side base 105 and inclined closer to the side base 105 toward the lower side thereof. That is, in the present invention, the baffle plate collectively represents a member capable of collecting the gas flowing downward inside the mini-environment 103 in front of the lower opening portion 105a.

Figure 3:
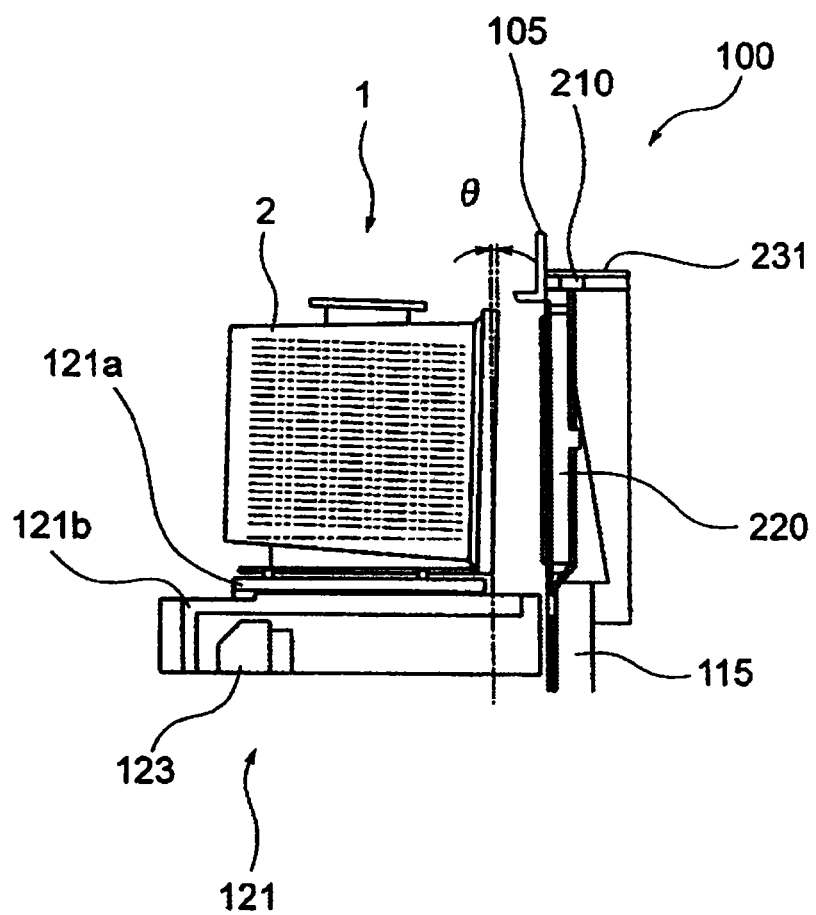
FIG. 3 is a side view illustrating a schematic configuration of a main part of a load port apparatus according to a further embodiment of the present invention in a layout similar to that of FIG. 1.

In this case, the above-mentioned pod 1 is generally made of a resin or the like, and has an individual error in shape. Further, the shape of the pod 1 may be changed over time depending on usage thereof. For example, depending on the shape of the pod main body 2 or the lid 3, a distance between the opening of the pod main body 2 and the plane of the side base 105 in which the first opening portion 111 is formed may vary at each position. For example, in a case of the pod 1 having such a characteristic in shape that the distance between the opening of the pod 1 and the side base 105 is larger at an upper portion of the pod 1 than a lower portion thereof, an unexpectedly large clearance may be formed between the upper portion of the pod 1 and the side base 105. Due to the presence of such a clearance, there occurs unexpected outflow of the inert gas into the working space. As a measure against such a case, according to a further embodiment of the present invention, the load port apparatus 100 is provided with a configuration illustrated in FIG. 3. Note that, FIG. 3 is a view illustrating only the pod 1, the first opening portion 111, and the mount base 121 related to that configuration in a layout similar to that of FIG. 1.

In this embodiment, the mount table 121a is inclined at a predetermined angle θ relative to a reference plane in which the mount table 121a is conventionally arranged so that the mount table 121a is lowered with respect to the first opening portion 111 as the mount table 121a approaches the side base 105. Accordingly, the pod 1 mounted on the mount table 121a is inclined at the angle θ so that the opening of the pod 1 is relatively closer to the door 115a at the upper portion of the opening than the lower portion thereof. Thus, when the interior of the pod main body 2 is caused to communicate to the first opening portion 111, even if the pod 1 is slightly changed in shape, the upper portion of the pod becomes closer to the first opening portion 111 due to the inclination at the angle θ, and accordingly it is possible to prevent leakage of the inert gas from the above-mentioned upper portion of the opening of the pod. Further, if the pod 1 has a larger distance on its lower side from the first opening portion 111, the inert gas leaking from the lower side is reduced in concentration and discharged to the external space 104 or the like due to the configuration arranged in the table cover 121b or the like. That is, any one of the mount base 121, the side base 105, and the door 115a is arranged so that the opening of the pod main body 2 is inclined at the predetermined angle relative to the first opening portion 111 provided in the side base 105.

With the above-mentioned configuration, the load port apparatus 100 according to this embodiment is capable of suppressing the outflow of the inert gas into the working space irrespective of the shape of the pod 1. Note that, there has been exemplified an embodiment in which the mount table 121a is inclined, but the present invention is not limited thereto. The same effect can be obtained even when, for example, the side base 105 or the door 115a has such an inclination angle as described above. Further, in this embodiment, there has been exemplified a configuration in which the mount table 121a moves in a direction of the inclination which lowers the mount table 121a as the mount table 121a approaches the side base 105, but the same effect can be obtained even in a configuration in which the pod 1 is mounted in a posture with an inclination at the angle θ relative to the mount table 121a, and the mount table 121a itself moves in a horizontal direction.

As described hereinabove, the present invention relates to a load port apparatus used suitably to semiconductor processing apparatus. However, the present invention is applicable not only to the semiconductor processing apparatus but also to so-called load port apparatus used for various processing apparatus in which various processes conforming to those for semiconductors are performed, such as processing apparatus which handle panels for liquid crystal displays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-151915, filed Jul. 8, 2011, which is hereby incorporated by reference herein in its entirety.

What is claimed is:

1. A load port apparatus, comprising:
    a side base serving as part of a wall that partitions a mini-environment;
    a door capable of closing an opening portion provided in the side base, the door being configured to hold a lid of a sealed container for containing an object to be contained, and open and close the lid of the sealed container so that the object to be contained is insertable into and removable from the sealed container;
    a mount base on which the sealed container is placeable, the mount base being capable of bringing the sealed container close to and apart from the opening portion; and
    an outside air supply device capable of introducing, into an internal space of the mount base, a gas in an external space separated from the mini-environment by the side base.

2. A load port apparatus according to claim 1, wherein the outside air supply device is arranged at a position communicating to the internal space of the mount base.

3. A load port apparatus according to claim 1, further comprising:
    a partition cover that houses a door drive mechanism for driving the door via a lower opening portion different from the opening portion provided in the side base, and forms a gas discharge space separated from the mini-environment by the side base; and
    a gas discharge duct serving as a passage through which a gas inside the gas discharge space is dischargeable.

4. A load port apparatus according to claim 3, further comprising a baffle plate arranged inside the mini-environment, for collecting a gas in front of the lower opening portion when the gas flows through the mini-environment from an upper side toward a lower side of the mini-environment.

5. A load port apparatus according to claim 3, further comprising a casing cover that is arranged on an outer side of the partition cover, and forms an auxiliary gas discharge space surrounding the gas discharge space,
   wherein a lower surface of the auxiliary gas discharge space is formed of a member comprising at least one of a slit, a mesh, and pores.

6. A load port apparatus according to claim 1, wherein at least one of the mount base, the side base, and the door is arranged so that an opening of the sealed container is inclined at a predetermined angle relative to the opening portion provided in the side base.

* * * * *